United States Patent
Gupta et al.

(10) Patent No.: US 8,320,201 B2
(45) Date of Patent: Nov. 27, 2012

(54) METHOD OF READING MEMORY CELL

(75) Inventors: Amit Kumar Gupta, Aligarh (IN);
Devesh Dwivedi, Bangalore (IN);
Sanjeev Kumar Jain, Ghaziabad (IN);
Yatender Mishra, Pitam Pura (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/434,881

(22) Filed: Mar. 30, 2012

(65) Prior Publication Data
US 2012/0188837 A1     Jul. 26, 2012

Related U.S. Application Data

(63) Continuation of application No. 12/624,403, filed on Nov. 23, 2009, now abandoned.

(30) Foreign Application Priority Data

Feb. 6, 2009     (IN) ............................ 231/DEL/2009

(51) Int. Cl.
*G11C 7/22*     (2006.01)

(52) U.S. Cl. ................................................. 365/189.15
(58) Field of Classification Search ............. 365/189.05, 365/189.08, 189.15, 203
See application file for complete search history.

(56) References Cited

U.S. PATENT DOCUMENTS

| | | | |
|---|---|---|---|
| 6,282,131 B1 | 8/2001 | Roy | |
| 6,438,023 B1 * | 8/2002 | Johnson | 365/154 |
| 6,711,092 B1 | 3/2004 | Sabharwal | |
| 8,040,746 B2 | 10/2011 | Jain | |
| 2004/0246812 A1 | 12/2004 | Bhavnagarwala | |
| 2009/0231938 A1 | 9/2009 | Joo | |

* cited by examiner

*Primary Examiner* — Hoai V Ho
*Assistant Examiner* — Pablo Huerta
(74) *Attorney, Agent, or Firm* — Charles Bergere

(57) ABSTRACT

A method for reading a memory cell (20) of a semiconductor memory (10) includes initiating a precharge or predischarge operation on a bit line (24) prior to arrival of a triggering edge of a clock signal (32) that initiates a read operation. A word line (22) is activated responsive to the triggering edge of the clock signal (32), and data is read from the memory cell (20).

15 Claims, 4 Drawing Sheets

METHOD OF READING MEMORY CELL

This application is a continuation of currently pending, prior patent application number 12/624,403 filed on Nov. 23, 2009.

BACKGROUND OF THE INVENTION

The present invention relates generally to semiconductor memories and more particularly to a method of reading a memory cell of a semiconductor memory.

The access time of a semiconductor memory is typically determined by summing clock-to-word line delay and word line-to-output delay. However, where precharging or predischarging is required for an access operation, the access time is determined by summing the word line-to-output delay together with the greater of either the clock-to-word line delay or clock-to-precharge/predischarge termination time. In such instances, the access time is often largely dependent on the clock-to-precharge/predischarge termination time, as the clock-to-precharge/predischarge termination time is usually substantially greater than the clock-to-word line delay. Consequently, the access time of such semiconductor memories often cannot be improved by optimizing the clock-to-word line delay since the access time is determined using the clock-to-precharge/predischarge termination time, and not the clock-to-word line delay.

Further, as technology scales, bit line resistance becomes increasingly more dominant, lengthening the clock-to-precharge/predischarge termination time in, for example, ultra-deep sub-micron (UDSM) technologies at or below 90 nanometers (nm). This increases memory access time, particularly of memory instances that have a large number of memory cells coupled to each bit line.

Hence, there is a need for a precharging or predischarging scheme that is operable to reduce memory access times, and thereby increase semiconductor memory speeds.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures.

DETAILED DESCRIPTION OF THE INVENTION

Figure 1:
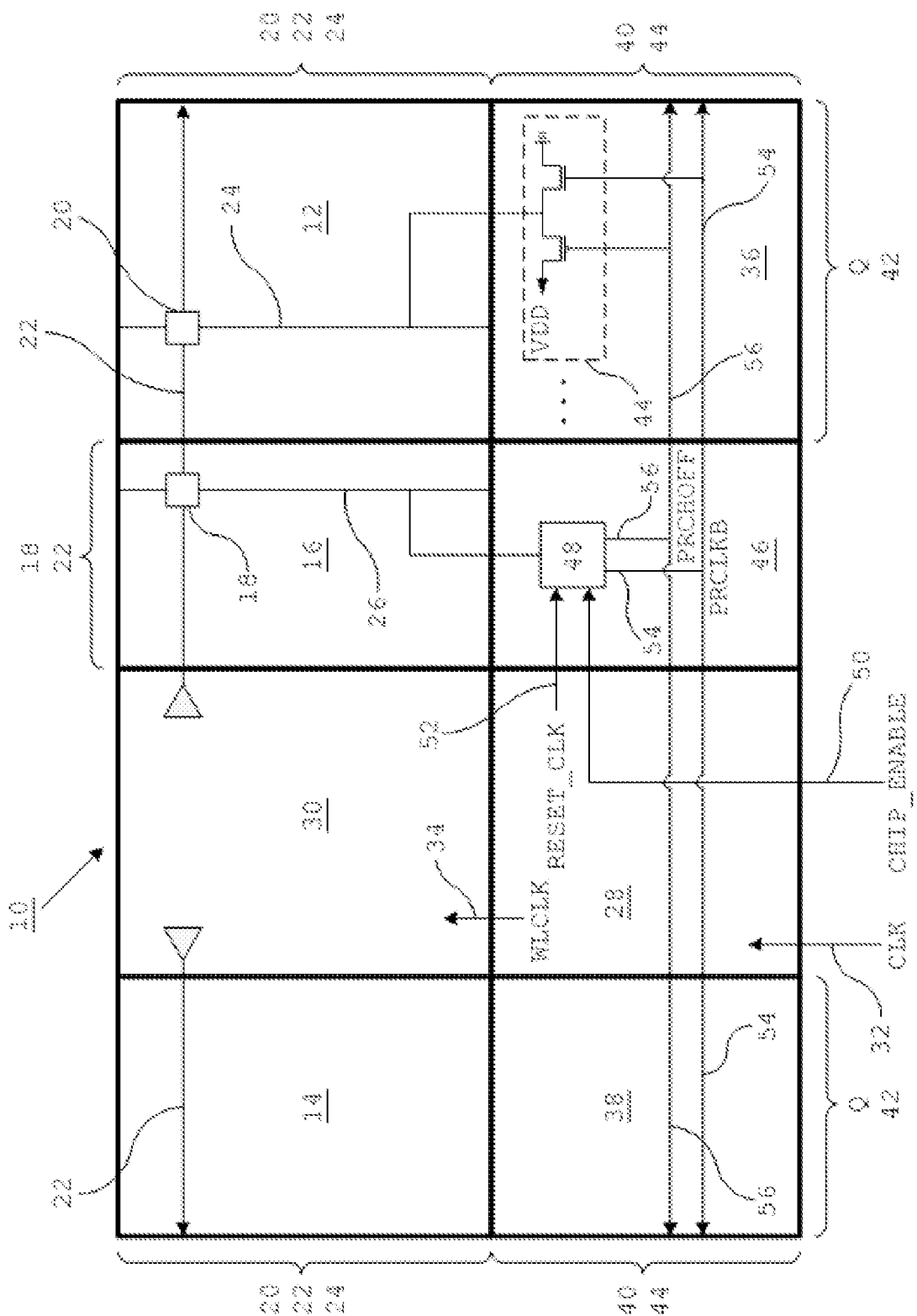
FIG. 1 is a schematic block diagram of a portion of a semiconductor memory in accordance with an exemplary embodiment of the present invention.

The detailed description set forth below in connection with the appended drawings is intended as a description of the presently preferred embodiment of the invention, and is not intended to represent the only form in which the present invention may be practiced. It is to be understood that the same or equivalent functions may be accomplished by different embodiments that are intended to be encompassed within the spirit and scope of the invention.

The present invention is directed to a method for reading a memory cell of a semiconductor memory. The method includes initiating a precharge or predischarge operation on a bit line prior to arrival of a triggering edge of a clock signal that initiates a read operation. A word line is activated responsive to the triggering edge of the clock signal, and data is read from the memory cell.

The present invention is also directed to a method for reading a memory cell of a zero current leakage type read-only memory (ROM). The method includes initiating a precharge or predischarge operation on a bit line prior to arrival of a triggering edge of a clock signal that initiates a read operation. A word line is activated responsive to the triggering edge of the clock signal, and data is read from the memory cell.

The present invention is further directed to a method for reading a memory cell of a zero current leakage type ROM including initiating a precharge or predischarge operation on a bit line and terminating the precharge or predischarge operation prior to word line activation. A word line is activated responsive to the triggering edge of the clock signal, and data is read from the memory cell.

The present invention is further yet directed to a semiconductor memory including a plurality of memory cells electrically connected in a matrix arrangement to a plurality of word lines and a plurality of bit lines. A precharge or predischarge pulse generating circuit is configured to generate a precharge or predischarge pulse that initiates a precharge or predischarge operation on at least one of the bit lines prior to arrival of a triggering edge of a clock signal that initiates a read operation. Sensing circuitry is configured to sense data on the bit lines. A plurality of reference memory cells may be electrically connected to a reference bit line and respective ones of the word lines.

The precharging or predischarging scheme of the present invention has several advantages. In particular, by initiating the precharge or predischarge operation prior to the arrival of the triggering edge of the clock signal that initiates the read operation, a portion or all of the time required for the precharging or predischarging operation is shifted ahead of the clock arrival time. This reduces the clock-to-precharge/predischarge termination time, thereby enabling computation of memory access time independently of the clock-to-precharge/predischarge termination time. Advantageously, memory access time may thus be reduced and further reduction in memory access time is possible by simply reducing the clock-to-word line delay.

Referring now to FIG. 1, a schematic block diagram of a portion of a semiconductor memory 10 in accordance with an exemplary embodiment of the present invention is shown.

The semiconductor memory 10 includes a first memory array 12, a second memory array 14, and a reference column 16 having a plurality of reference memory cells 18. Each of the first and second memory arrays 12 and 14 includes a plurality of memory cells 20 electrically connected in a matrix arrangement to a plurality of word lines (WLs) 22 and a plurality of bit lines (BLs) 24. The reference memory cells 18 are electrically connected to respective ones of the WLs 22 and a reference bit line (RBL) 26. For clarity purposes, not all the reference memory cells 18, memory cells 20, WLs 22 and BLs 24 are shown in FIG. 1. Nonetheless, as will be understood by those of ordinary skill in the art, the first and second memory arrays 12 and 14 and the reference column 16 may include any desired number of reference memory cells 18, memory cells 20, WLs 22 and BLs 24.

The first and second memory arrays 12 and 14 and the reference column 16 share and are coupled to control circuitry 28 via row decoder (XDEC) circuitry 30. The control circuitry 28 receives a clock (CLK) signal 32 and generates a word line clock (WLCLK) signal 34 that is used by the XDEC circuitry 30 along with other address signals to select a particular WL 22 for activation. The control circuitry 28 and the XDEC circuitry 30 are well known to those of ordinary skill in the art. Therefore, detailed description thereof is not required for a complete understanding of the present invention.

The first memory array 12 is coupled to a first input/output (I/O) section 36, and the second memory array 14 is coupled to a second IO section 38. Each of the first and second IO sections 36 and 38 includes sensing circuitry 40 configured to sense data on the BLs 24. The sensing circuitry 40 may comprise any conventional sensing circuitry for semiconductor memories. Accordingly, detailed description of the sensing circuitry 40 is not required for a complete understanding of the present invention. An output (Q) 42 may be read from the first and second IO sections 36 and 38.

In the embodiment shown, precharging circuitry 44 is included in the first and second IO sections 36 and 38. The precharging circuitry 44 is configured to precharge the BLs 24 to a precharge voltage level. For clarity purposes, only one (1) precharging circuit 44 is illustrated in FIG. 1. Nonetheless, as will be understood by those of ordinary skill in the art, the first and second IO sections 36 and 38 may include any desired number of precharging circuits 44, depending, for example, on the number of BLs 24 in the first and second memory arrays 12 and 14. Further, although illustrated as part of the first and second IO sections 36 and 38 in FIG. 1, it should be understood that the present invention is not limited by the position of the precharging circuitry 44 relative to the other elements of the semiconductor memory 10. For instance, the precharging circuitry 44 may be incorporated as part of the first and second memory arrays 12 and 14 in an alternative embodiment.

The reference column 16 is coupled to a reference IO section 46. The reference IO section 46 includes a precharge pulse generating circuit 48. The precharge pulse generating circuit 48 is configured to receive a chip enable (CHIP_ENABLE) signal 50 and a reset clock (RESET_CLK) signal 52. The precharge pulse generating circuit 48 is further configured to generate a precharge clock (PRCLKB) signal 54 and a precharge pulse (PRCHOFF) 56 for initiating and terminating precharging operations on the BLs 24 and the RBL 26. Accordingly, as shown in FIG. 1, the PRCLKB signal 54 and the PRCHOFF pulse 56 generated by the precharge pulse generating circuit 48 are transmitted to the precharging circuitry 44 in the first and second IO sections 36 and 38 to enable or disable the precharging circuitry.

The semiconductor memory 10 may be a zero current leakage type read-only memory (ROM) or any other suitable memory type known to those of ordinary skill in the art. Although illustrated as having a reference column 16, it should be understood by those of ordinary skill in the art that the present invention is not limited to the described circuit configuration. For example, the semiconductor memory 10 may include a reference word line coupled to a reference bit line in one alternative embodiment and may not include any reference lines in another.

In the present embodiment, circuitry in the reference column 16 and the reference IO section 46 mimics actual access operations within the semiconductor memory 10. Correspondingly, the precharge pulse generating circuit 48 mimics precharging operations on the actual BLs 24. Advantageously, this allows the precharge pulse generating circuit 48 to generate an appropriate PRCHOFF pulse 56 for controlling the precharging operations on the actual BLs 24, thereby overcoming the difficulty in determining when precharging of the multiple BLs 24 is sufficiently complete for precharging to be stopped.

Nonetheless, although illustrated as part of the reference IO section 46 in FIG. 1, it should be understood that the present invention is not limited by the position of the precharge pulse generating circuit 48 relative to the other elements of the semiconductor memory 10. The precharge pulse generating circuit 48 may be provided in other sections of the semiconductor memory 10 such as, for example, the control circuitry section 28 in other embodiments.

The RESET_CLK signal 52 may be configured to ensure that all signals within the semiconductor memory 10 revert to their steady state or default values in anticipation of a next memory access cycle. In one embodiment, the RESET_CLK signal 52 may be generated by a self-timing circuit (not shown) in the control circuitry section 28 or derived from a falling edge of an external clock signal.

Figure 2A:
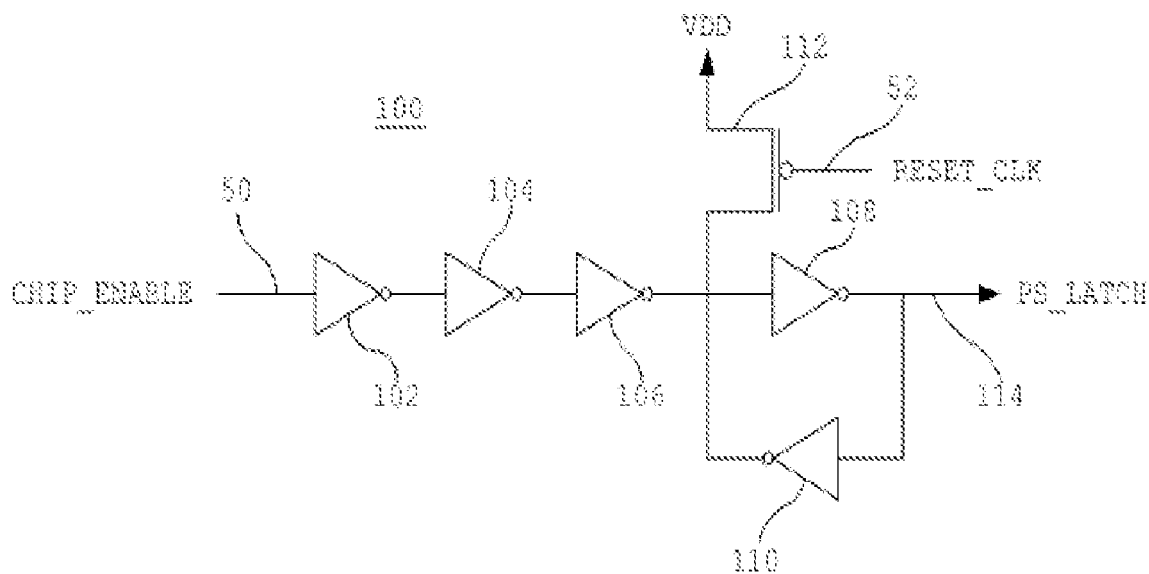
FIGS. 2A through 2C are schematic circuit diagrams illustrating a precharge pulse generating circuit for the semiconductor memory of FIG. 1.
Figure 2B:
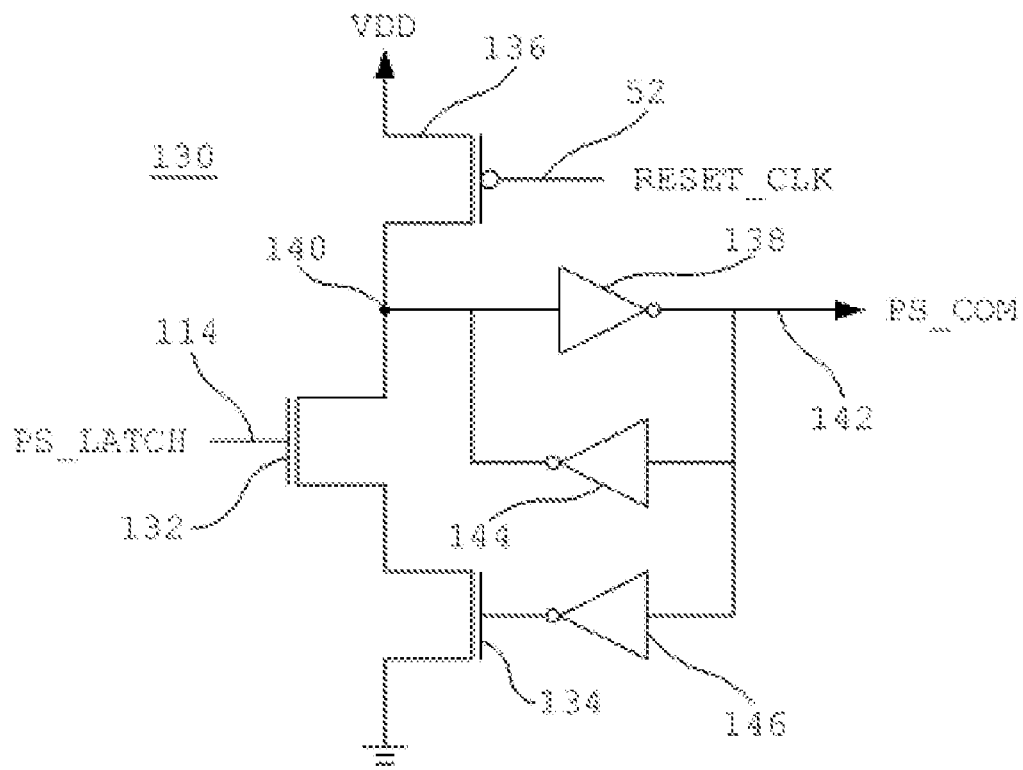
Figure 2C:
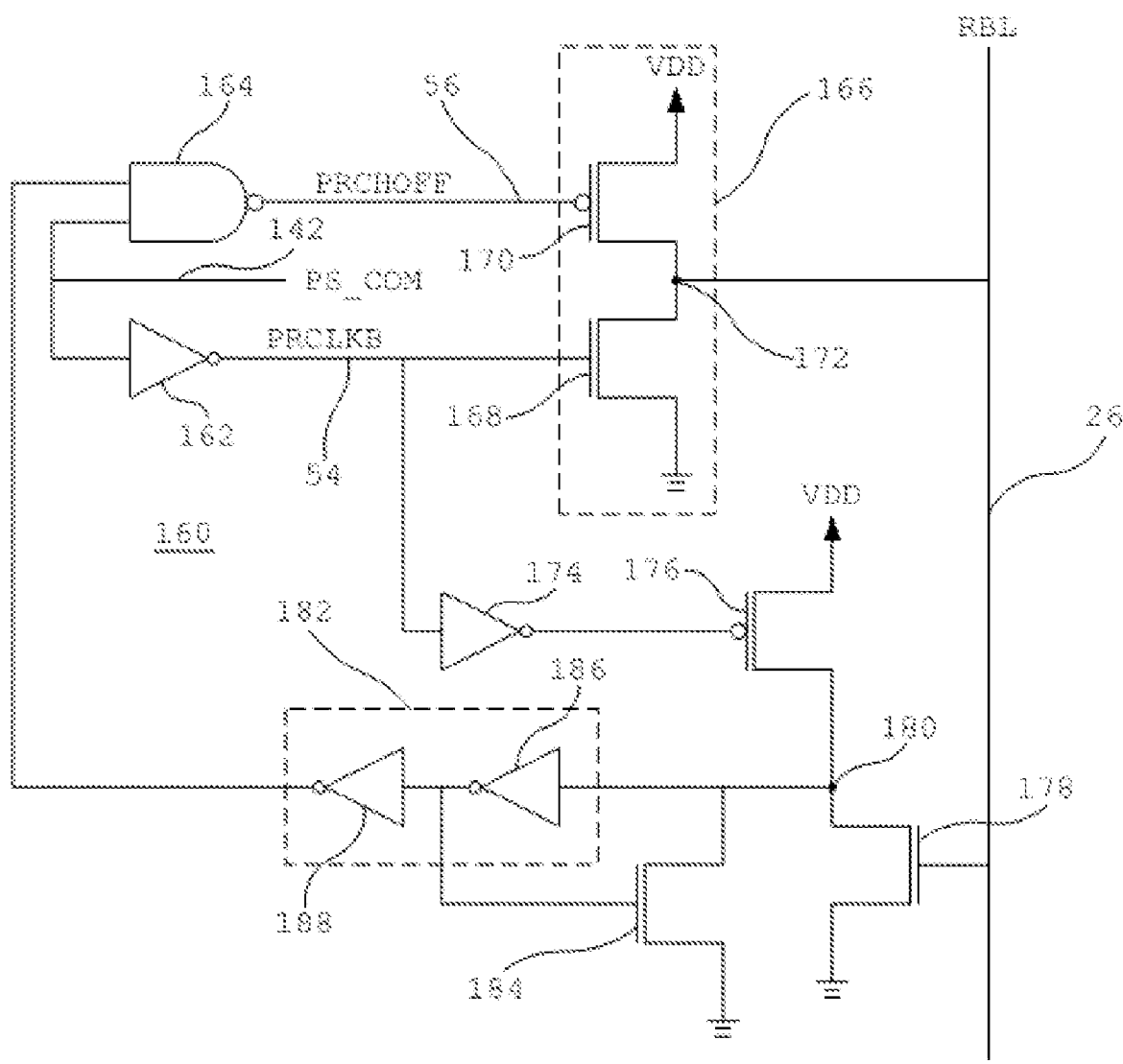

The precharge pulse generating circuit 48 will now be described in greater detail below with reference to the schematic circuit diagrams of FIGS. 2A through 2C illustrating an exemplary precharge pulse generating circuit 48 for the semiconductor memory 10 of FIG. 1.

Referring now to FIG. 2A, a first portion 100 of the precharge pulse generating circuit 48 is shown. The first portion 100 of the precharge pulse generating circuit 48 includes a plurality of inverters 102, 104, 106 and 108 coupled in series, a first feedback inverter 110, and a first reset transistor 112. A first of the inverters 102 is configured to receive the CHIP_ENABLE signal 50 and a fourth of the inverters 108 is configured to output a latch signal (PS_LATCH) 114. The PS_LATCH signal 114 is fed back through the first feedback inverter 110 as an input to the fourth inverter 108 to hold the PS_LATCH signal 114. The output of the first feedback inverter 110 is also coupled to the first reset transistor 112. A gate of the first reset transistor 112 is configured to receive the RESET_CLK signal 52.

Although four (4) series-coupled inverters 102, 104, 106 and 108 are shown in FIG. 2A, it will be understood by those of skill in the art that the present invention is not limited to four gate delays. The duration of the delay may be shortened or lengthened in alternative embodiments by employing fewer or greater numbers of series-coupled inverters depending, for example, on the input pin capacitance and/or input pin hold time.

In the embodiment shown, the first reset transistor 112 is a p-type transistor having a drain coupled to an output of the first feedback inverter 110 and a source coupled to a supply voltage VDD. It should however be understood by those of ordinary skill in the art that the present invention is not limited by the type of transistor employed.

Referring now to FIG. 2B, a second portion 130 of the precharge pulse generating circuit 48 is shown. The second portion 130 of the precharge pulse generating circuit 48 includes a first transistor 132 coupled between a second transistor 134 and a second reset transistor 136. A gate of the first transistor 132 is configured to receive the PS_LATCH signal 114 from the first portion 100 of the precharge pulse generating circuit 48. An input of a fifth inverter 138 is coupled to a node 140 between the first transistor 132 and the second reset transistor 136. The fifth inverter 138 is configured to output a common precharge signal PS_COM 142. The PS_COM signal 142 is fed back through a second feedback inverter 144 as an input to the fifth inverter 138 to hold the PS_COM signal 142. The PS_COM signal 142 is also fed back through a third feedback inverter 146 to a gate of the second transistor 134. A gate of the second reset transistor 136 is configured to receive the RESET_CLK signal 52.

In the embodiment shown, the first and second transistors 132 and 134 are n-type transistors and the second reset transistor 136 is a p-type transistor. A source of the first transistor 132 is coupled to a drain of the second transistor 134, and a drain of the first transistor 132 is coupled to a drain of the second reset transistor 136 at node 140. A source of the second transistor 134 is coupled to ground, and a source of the second reset transistor 136 is coupled to the supply voltage VDD. Nonetheless, it should be understood by those of ordinary skill in the art that the present invention is not limited by the types of transistors employed.

Referring now to FIG. 2C, a third portion 160 of the precharge pulse generating circuit 48 is shown. The third portion 160 of the precharge pulse generating circuit 48 includes a sixth inverter 162 and a NAND gate 164. The PS_COM 142 signal from the second portion 130 of the precharge pulse generating circuit 48 is received as an input to the sixth inverter 162 and as a first input to the NAND gate 164. The sixth inverter 162 is configured to output the PRCLKB signal 54, and the NAND gate 164 is configured to output the PRCHOFF pulse 56.

The PRCLKB signal 54 and the PRCHOFF pulse 56 are received as inputs to an RBL precharge circuit 166. The RBL precharge circuit 166 comprises a third transistor 168 and a fourth transistor 170 coupled at a node 172 to the RBL 26. A gate of the third transistor 168 is configured to receive the PRCLKB signal 54, and a gate of the fourth transistor 170 is configured to receive the PRCHOFF pulse 56.

The PRCLKB signal 54 is also received as an input to a seventh inverter 174. An output of the seventh inverter 174 is received at a gate of a fifth transistor 176. A sixth transistor 178 having a gate coupled to the RBL 26 is coupled to the fifth transistor 176 at a node 180.

A programmable delay circuit 182 is coupled between the fifth and sixth transistors 176 and 178 at node 180. An output of the programmable delay circuit 182 is received as a second input to the NAND gate 164. A gate of a seventh transistor 184 is coupled to the programmable delay circuit 182.

In the present embodiment, the third, sixth and seventh transistors 168, 178 and 184 are n-type transistors and the fourth and fifth transistors 170 and 176 are p-type transistors. A source of the third transistor 168 is coupled to ground, and a drain of the third transistor 168 is coupled to a drain of the fourth transistor 170 at node 172. Sources of the fourth and fifth transistors 170 and 176 are coupled to the supply voltage VDD. A drain of the fifth transistor 176 is coupled to a drain of the sixth transistor 178 at node 180. A source of the sixth transistor 178 is coupled to ground. A drain of the seventh transistor 184 is coupled to an input of the programmable delay circuit 182, and a source of the seventh transistor 184 is coupled to ground. It should however be understood by those of ordinary skill in the art that the present invention is not limited by the types of transistors employed.

In the embodiment shown, the programmable delay circuit 182 includes an eighth inverter 186 and a ninth inverter 188 connected in series. An output of the eighth inverter 186 is received at the gate of the seventh transistor 184. Although illustrated as having two (2) inverters in FIG. 2C, it will be understood by those of skill in the art that the present invention is not limited to a programmable delay circuit 182 having only two gate delays. The duration of the delay may be programmed by lengthening or shortening the delay chain in the programmable delay circuit 182.

The transistors in FIGS. 2A through 2C may also include a bulk terminal. Unless noted otherwise, the bulk terminals of the n-type transistors are connected to ground and that of the p-type transistors are connected to the supply voltage VDD.

Having described the various components of the precharge pulse generating circuit 48, an operation to read one of the memory cells 20 of the semiconductor memory 10 of FIG. 1 storing a LOW logic value using the precharge pulse generating circuit 48 of FIGS. 2A through 2C will now be described below with reference to the timing diagram 200 of FIG. 3.

Figure 3:
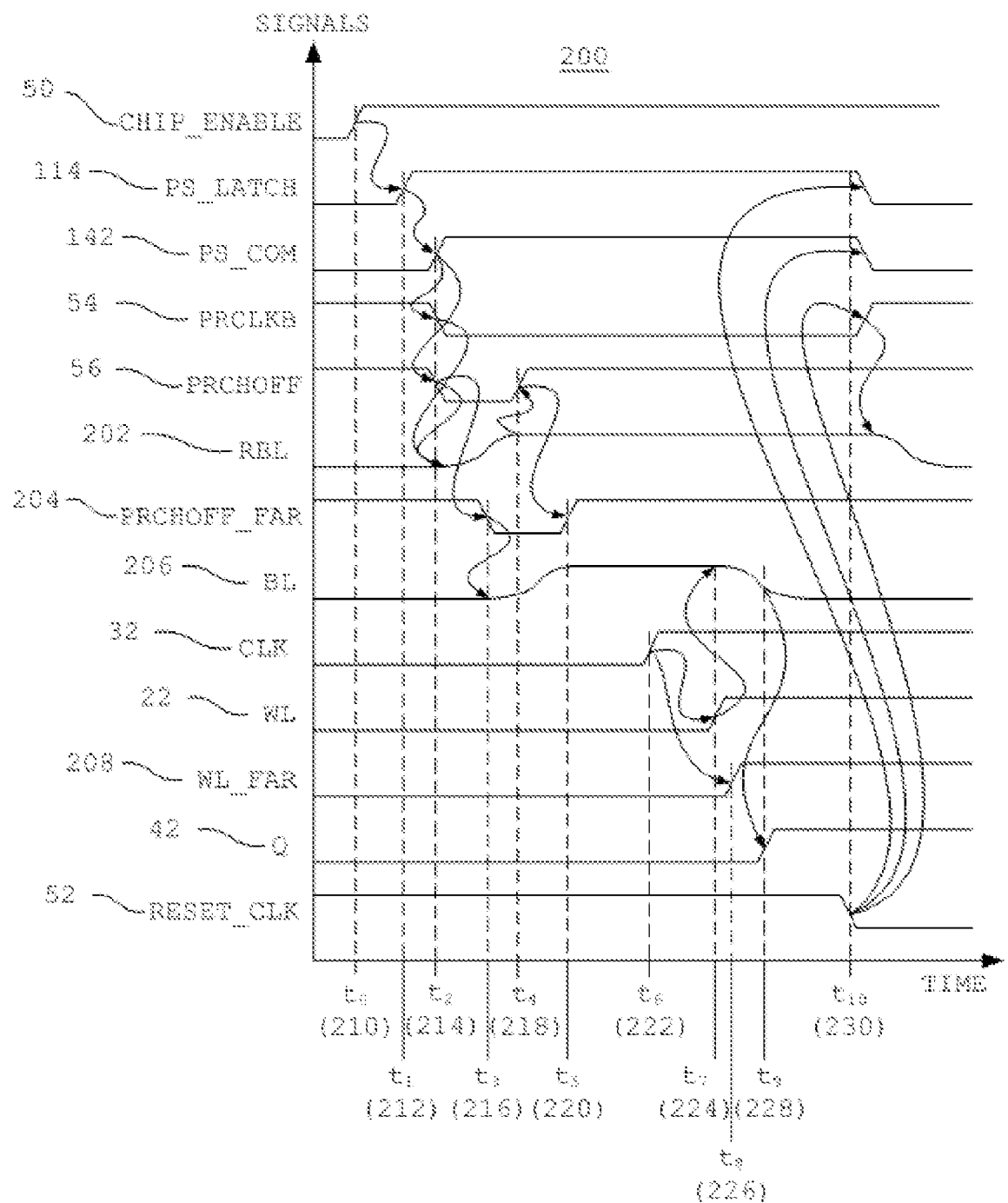
FIG. 3 is a timing diagram illustrating an operation to read a memory cell of the semiconductor memory of FIG. 1 using the precharge pulse generating circuit of FIGS. 2A through 2C.

Referring now to FIG. 3, the timing diagram 200 includes a signal representative of the CHIP_ENABLE signal 50 (FIGS. 1 and 2A), a signal representative of the PS_LATCH signal 114 (FIGS. 2A and 2B), a signal representative of the PS_COM signal 142 (FIGS. 2B and 2C), a signal representative of an active low PRCLKB signal 54 (FIGS. 1 and 2C), a signal representative of an active low PRCHOFF pulse 56 (FIGS. 1 and 2C), a signal 202 representative of the voltage level on the RBL 26 (FIGS. 1 and 2C), a signal 204 representative of an active low precharging pulse PRCHOFF_FAR received by precharging circuitry 44 coupled to a BL 24 along a critical path, that is, the BL 24 furthest from the precharge pulse generating circuit 48 (FIG. 1), a signal 206 representative of the voltage level on the BL 24 along the critical path (FIG. 1), a signal representative of the CLK signal 32 (FIG. 1), a signal representative of the assertion of a WL 22, a signal 208 representative of the assertion of a WL 22 along the critical path, that is, the WL 22 furthest from the control circuitry 28 (FIG. 1), a signal representative of the output Q 42 read out from the memory cell 20 (FIG. 1), and a signal representative of the RESET_CLK signal 52 (FIGS. 1, 2A and 2B).

At time $t_0$ (time 210), the CHIP_ENABLE signal 50 is asserted or pulled high. This causes the PS_LATCH signal 114 to be pulled high at time $t_1$ (time 212), switching on the first transistor 132. Consequently, node 140 is pulled low and the PS_COM signal 142 is pulled high at time $t_2$ (time 214).

A low signal is received at the gate of the second transistor 134. This switches the second transistor 134 off, locking the value of the PS_COM signal 142 on the rising edge of the PS_LATCH signal 114. Consequently, the PS_COM signal 142 is not impacted if the PS_LATCH signal 114 subsequently goes low, for example, when the CHIP_ENABLE signal 50 is pulled down.

When the PS_COM signal 142 is pulled high at time $t_2$ (time 214), both the PRCLKB signal 54 and the PRCHOFF pulse 56 are pulled low, and precharging of the RBL 26 is initiated.

The PRCLKB signal 54 and the PRCHOFF pulse 56 are transmitted to the precharging circuitry 44. Consequently, at time $t_3$ (time 216), the PRCHOFF_FAR pulse is pulled low, initiating a precharge operation on the BL 24 in the critical path prior to arrival of a triggering edge of the CLK signal 32 that initiates the read operation.

The seventh inverter 174 receives the low PRCLKB signal 54 and outputs a high signal to the gate of the fifth transistor 176. This switches the fifth transistor 176 off.

Consequent to the precharge operation on the RBL 26, the sixth transistor 178 is switched on after a period of time, and node 180 is pulled low.

After a period of delay imparted by the programmable delay circuit 182, the second input to the NAND gate 164 is pulled low, and the PRCHOFF pulse 56 output from the NAND gate 164 is pulled high at time $t_4$ (time 218), terminating the precharging operation on the RBL 26.

The change in the PRCHOFF pulse 56 is transmitted to the precharging circuitry 44. Consequently, at time $t_5$ (time 220), the PRCHOFF_FAR pulse is pulled high, terminating the precharge operation on the BL 24 in the critical path.

At time $t_6$ (time 222), the CLK signal 32 is asserted or pulled high. A WL 22 is activated at time $t_7$ (time 224) responsive to the triggering edge of the CLK signal 32 and, consequently, discharge of the BL 24 is initiated. The triggering edge of the CLK signal 32 is propagated to other WLs 22 and at time $t_8$ (time 226), the WL 22 in the critical path is activated. Data is read from the memory cell 20 at time $t_9$ (time 228).

At time $t_{10}$ (time 230), the RESET_CLK 52 is asserted or pulled low. This resets the PRCLKB signal 54, the PS_LATCH signal 114 and the PS_COM signal 142 to their steady state or default values in anticipation of the next read cycle.

By initiating the precharge operation before the arrival of the triggering edge of the CLK signal 32 that initiates the read operation, a portion or all of the time required for the precharging operation is shifted ahead of the clock arrival time $t_6$ (time 222) to the setup time of the CHIP_ENABLE signal 50. In one embodiment, the precharge operation may be initiated a worst case setup time before the arrival of the triggering edge of the clock signal. For example, if the longest setup time of all the pins of a semiconductor memory is between about 400 picoseconds (ps) and about 800 ps, then the precharge operation may be initiated between about 400 ps and about 800 ps before the arrival of the triggering edge of the clock signal. Advantageously, this reduces the clock-to-precharge termination time, thereby enabling computation of the memory access time independently of the clock-to-precharge termination time. Memory access time may thus be reduced and further reduction in memory access times is possible by simply reducing the clock-to-word line delay, for example, by reducing a gate count along a path from a clock input to the word line to less than or equal to about six (6) gates.

In the present embodiment, the precharge operation on the BLs 24 and RBL 26 is terminated before any of the WLs 22 are activated. Advantageously, this prevents an overlap of an active precharge signal with an active WL signal, thereby preventing short circuit power dissipation.

In the embodiment shown, the precharge operation is initiated by asserting the CHIP_ENABLE signal 50. Accordingly, the precharge operation takes place during chip enable setup time. However, as will be understood by those of ordinary skill in the art, the present invention is not limited to precharge initiation via the CHIP_ENABLE signal 50. The precharge operation may be initiated using other reference signals or pins available to the semiconductor memory 10 or via a separately provided precharge initiation signal or pin, in alternative embodiments. In one embodiment, the precharge operation may be initiated by asserting an asynchronous signal or pin. As such, the precharge operation may be performed during a setup time of the semiconductor memory 10.

In one embodiment, the precharge pulse generating circuit 48 may be configured to generate a PRCHOFF pulse 56 that terminates the precharge operation when the BLs 24 and the RBL 26 are precharged to about 95 percent (%) of the supply voltage VDD.

In the present embodiment, the read operation occurs in a clock high period and, consequently, the precharge operation is initiated during a clock low period. However, as will be understood by those of ordinary skill in the art, this may be reversed in alternative embodiments, that is, the read operation may occur in the clock low period and the precharge operation may consequently be initiated during the clock high period.

Although a semiconductor memory 10 employing bit line precharging is described in FIGS. 1 through 3, it should be understood by those of ordinary skill in the art that the present invention is not limited to memories that employ bit line precharging. The present invention may be employed in semiconductor memories that require predischarging before a read access operation in alternative embodiments. As such memories are well known in the art, detailed description thereof is not required for a complete understanding of the present invention.

The description of the preferred embodiment of the present invention has been presented for purposes of illustration and description, but is not intended to be exhaustive or to limit the invention to the form disclosed. It will be appreciated by those skilled in the art that changes could be made to the embodiment described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A precharge circuit for precharging a bit line of a semiconductor memory device, the precharge circuit comprising:
   a plurality of series connected inverters for generating a latch signal;
   a first feedback inverter having an input connected to a last inverter of the plurality of series connected inverters and an output connected to an input of the last inverter of the plurality of series connected inverters;
   a first reset transistor connected between the output of said last inverter and a first supply voltage, and having a gate that receives a reset clock signal;
   a first transistor having a gate that receives the latch signal;
   a second transistor connected between the first transistor and a second supply voltage;
   a second reset transistor connected between the first transistor and the first supply voltage, and having a gate that receives the reset clock signal;
   a common precharge inverter having an input connected to a first node between the first transistor and the second reset transistor, and an output that provides a common precharge signal;
   a second feedback inverter having an input connected to the output of the common precharge inverter and an output connected to the first node;
   a third feedback inverter having an input connected to the output of the common precharge inverter and an output connected to a gate of the second transistor;
   a logic gate having a first input connected to the output of the common precharge inverter for receiving the common precharge signal, and an output that provides a precharge pulse;
   a first precharge clock inverter having an input connected to the output of the common precharge inverter for receiving the common precharge signal, and an output that provides a precharge clock signal;
   a second precharge clock inverter having an input connected to the output of the first precharge clock inverter;
   a fifth transistor having a gate connected to an output of the second precharge clock inverter, and a source connected to the first power supply;
   a sixth transistor having a gate connected to a reference bit line of the semiconductor memory, and a drain connected to a drain of the fifth transistor;
   a seventh transistor having a drain connected to a drain of the fifth transistor; and
   a programmable delay circuit that has an input connected to the drain of the fifth transistor and an output connected to a second input of the logic gate.

2. The precharge circuit of claim 1, further comprising a reference bit line precharge circuit connected to the reference bit line, the reference bit line precharge circuit comprising:
- a third transistor connected to the first precharge clock inverter and having a gate that receives the precharge clock signal; and
- a fourth transistor connected to the logic gate and having a gate that receives the precharge pulse, wherein the reference bit line is connected to a node between the third and fourth transistors.

3. The precharge circuit of claim 2, wherein the third transistor is a NMOS transistor and the fourth transistor is a PMOS transistor, wherein the third transistor has a drain connected to the second power supply, and the fourth transistor has a source connected to the first power supply and a drain connected to a source of the third transistor.

4. The precharge circuit of claim 1, wherein the first inverter in the series receives a chip enable signal and the last inverter in the series outputs the latch signal.

5. The precharge circuit of claim 4, wherein the plurality of series connected inverters comprises four inverters.

6. The precharge circuit of claim 4, wherein the first reset transistor is a PMOS transistor.

7. The precharge circuit of claim 6, wherein the first transistor and second transistors comprise NMOS transistors.

8. The precharge circuit of claim 7, wherein the second reset transistor is a PMOS transistor.

9. The precharge circuit of claim 4, wherein the first power supply comprises a positive voltage supply and the second power supply comprises a ground.

10. The precharge circuit of claim 4, wherein the precharge clock signal initiates precharging of the bit line.

11. The precharge circuit of claim 10, wherein the precharge pulse terminates the precharging of the bit line.

12. The precharge circuit of claim 4, wherein the logic gate comprises a NAND gate.

13. The precharge circuit of claim 1, wherein the fifth transistor has a source connected to the first power supply, and the sixth transistor has a source connected to the second power supply.

14. The precharge circuit of claim 1, wherein the programmable delay circuit comprises two or more series connected inverters.

15. The precharge circuit of claim 14, wherein a gate of the seventh transistor is connected to an output of a first one of the two or more series connected inverters.

* * * * *